(12) United States Patent
Shimazawa et al.

(10) Patent No.: US 6,562,199 B2
(45) Date of Patent: May 13, 2003

(54) MANUFACTURING METHOD OF MAGNETORESISTIVE ELEMENT AND FILM FORMING APPARATUS

(75) Inventors: Koji Shimazawa, Chuo-ku (JP); Yoshihiro Tsuchiya, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/985,481

(22) Filed: Nov. 5, 2001

(65) Prior Publication Data

US 2002/0078550 A1 Jun. 27, 2002

(30) Foreign Application Priority Data

Nov. 9, 2000 (JP) .......................... 2000-341467

(51) Int. Cl.⁷ ................ C23C 14/34; B05D 5/12; B05D 3/02; B05D 3/00
(52) U.S. Cl. ............... 204/192.1; 427/128; 427/130; 427/372.2; 427/398.1
(58) Field of Search ............. 204/192.1, 298.25; 427/128, 130, 372.2, 398.1; 118/641, 704, 706

(56) References Cited

U.S. PATENT DOCUMENTS

| | | | | |
|---|---|---|---|---|
| 5,292,393 A | * | 3/1994 | Maydan et al. | 156/345.32 |
| 5,835,305 A | * | 11/1998 | Hamaguchi et al. | 360/234.1 |
| 5,895,727 A | * | 4/1999 | Hasegawa | 428/692 |
| 6,228,276 B1 | * | 5/2001 | Ju et al. | 216/22 |

OTHER PUBLICATIONS

English translation of JP 9–8380.*
JP 4–103014 English Abstract.
JP 2001–36165 English Abstract.

* cited by examiner

Primary Examiner—Steven H. VerSteeg
(74) Attorney, Agent, or Firm—Oblon, Spivak, McClelland, Maier & Neustadt, P.C.

(57) ABSTRACT

There is disclosed a manufacturing method of a magnetoresistive element of the present invention, comprising: a step of preparing a substrate having a thermal conductivity in a range of 5 to 150 $Wm^{-1}K^{-1}$; a substrate cooling step of moving the substrate into a vacuum cooling chamber, and cooling the substrate at an absolute temperature of 200 K or less in the vacuum cooling chamber; and a laminated film forming step of moving the cooled substrate into a vacuum film forming chamber, fixing the substrate to a substrate holder, and forming a magnetoresistive laminated film on the substrate while rotating the substrate, so that the manufacturing method of the magnetoresistive element is little in dispersion of element property, high in reliability, and superior in productivity.

10 Claims, 5 Drawing Sheets

MANUFACTURING METHOD OF MAGNETORESISTIVE ELEMENT AND FILM FORMING APPARATUS

BACKGROUND OF THE INVENTION

1. Field of the Invention

The present invention relates to a manufacturing method of a magnetoresistive element for reading a magnetic field intensity of a magnetic recording medium or the like as a signal and a film forming apparatus for carrying out the manufacturing method.

2. Description of the Related Art

With a high density of a hard disk (HDD), there is a demand for a high-sensitivity high-output head. To satisfy the demand, a giant magnetoresistive (GMR) film having a further enhanced property, a ferromagnetic tunnel magnetoresistive (TMR) element utilizing a ferromagnetic tunnel effect, and a current perpendicular to the plane (CPP)-GMR element have newly been proposed.

In order to enhance the property of the GMR film, a method of reducing thickness of a so-called free layer, for example, thickness of a nonmagnetic spacer layer formed, for example, of Cu is basically used. When the layer is thinned in this manner, a resistance value and resistance change amount of the GMR film can be increased. As a result, an output can be increased. Moreover, when recording density is progressively enhanced, the GMR film has to be thin also from a demand for reduction of a shield gap. However, with the thinned layer, there is a problem that ferromagnetic coupling effect (orange peel effect) of so-called pinned and free layers of the GMR film increases and that reproduction sensitivity of the head is dulled. It has been reported that the ferromagnetic coupling is brought about by surface roughness of an interface of the nonmagnetic spacer layer (e.g., Cu layer), and there has been a demand for a technique of smoothening the interface.

Generally in a research of formation of a deposited film, a technique of fining a grain constituting the film is known as one technique for enhancing smoothness of the deposited film, and for this a technique of forming the deposited film while cooling a substrate is known.

Such conventional vapor deposition method performed while cooling the substrate is applied to a sputtering process used simply in a process of forming a magnetoresistive film. It has been found that the following disadvantages occur in this method.

That is, when the substrate is cooled and subsequently the film is sputtered/formed in a vacuum film forming apparatus, a method of forming a structure for passing refrigerants such as liquid nitrogen and liquid helium into a substrate holder, leaving the substrate laid on the holder to stand for a predetermined time to cool the substrate, and successively depositing a predetermined laminated film indicating a magnetoresistive effect on the substrate by a sputtering process is used.

However, since the structure for passing the refrigerant through the substrate holder is used in the method, the substrate cannot be rotated during film formation. Therefore, a state of the thin film deposited on the substrate tends to differ with a substrate position. For example, when 4,000 elements are formed from one wafer substrate, dispersion of properties among the respective elements is possibly generated.

Moreover, when one stage is used to perform a substrate cooling operation and film forming operation in a usual film forming apparatus not particularly devised, the following two problems arise from a viewpoint of productivity. That is, as one problem, a waiting time of about 30 minutes is required from when the substrate is set in the substrate position in a film forming chamber until the substrate is cooled at a desired temperature. During this time, the film forming operation is discontinued. As the other problem, after the film formation, a waiting time is necessary until the substrate temperature returns to room temperature. A reason why the waiting time is necessary to set the substrate temperature back to the room temperature is that dew condensation occurs with the cooled substrate laid in the atmosphere and the film is corroded.

SUMMARY OF THE INVENTION

To solve the aforementioned problem, the present inventors have noted properties of a substrate usable in a magnetoresistive element, have intensively researched inventive process steps irrespective of a conventional process technique, and have developed a manufacturing method of a magnetoresistive element which has little dispersion of element properties, high reliability, and superior productivity.

That is, according to the present invention, there is provided a manufacturing method of a magnetoresistive element comprising: a step of preparing a substrate having a thermal conductivity in a range of 5 to 150 $Wm^{-1}K^{-1}$; a substrate cooling step of moving the substrate into a vacuum cooling chamber, and cooling the substrate in the vacuum cooling chamber at an absolute temperature of 200 K or less; and a laminated film forming step of moving the cooled substrate into a vacuum film forming chamber, fixing the substrate to a substrate holder, and forming a magnetoresistive laminated film on the substrate while rotating the substrate.

Moreover, according to the present invention, there is provided a manufacturing method of a magnetoresistive element comprising: a step of preparing a substrate having a thermal conductivity in a range of 5 to 150 $Wm^{-1}K^{-1}$; a substrate cooling step of moving the substrate into a vacuum cooling chamber, and cooling the substrate in the vacuum cooling chamber at an absolute temperature of 200 K or less; a laminated film forming step of moving the cooled substrate into a vacuum film forming chamber, fixing the substrate to a substrate holder, and forming a magnetoresistive laminated film on the substrate while rotating the substrate; and a step of moving the substrate with the laminated film formed thereon into a vacuum temperature raising chamber, and raising the temperature of the substrate with the film formed thereon in a forced manner in the vacuum temperature raising chamber.

Moreover, in a preferred embodiment, the magnetoresistive laminated film in the present invention is constituted as a giant magnetoresistive film.

Furthermore, in another preferred embodiment, the magnetoresistive laminated film in the present invention is constituted as a tunnel magnetoresistive film.

Additionally, in another preferred embodiment, the magnetoresistive laminated film in the present invention is constituted as a spin-valve magnetoresistive film.

Moreover, in another preferred embodiment, the magnetoresistive laminated film in the present invention is constituted as a film formed by a sputtering process.

According to the present invention, there is provided a film forming apparatus comprising: a substrate standby chamber in which a substrate is on standby; a substrate cooling chamber for cooling the substrate; a vacuum film forming chamber for forming a magnetoresistive laminated film on the substrate; and a robot chamber including a robot which can convey the substrate at least to the substrate standby chamber, the substrate cooling chamber and the vacuum film forming chamber, wherein the substrate standby chamber, the substrate cooling chamber and the vacuum film forming chamber are disposed as independent chambers centering on and on a peripheral edge of the robot chamber via respective shutters.

According to the present invention, there is provided a film forming apparatus comprising: a substrate standby chamber in which a substrate is on standby; a substrate cooling chamber for cooling the substrate; a vacuum film forming chamber for forming a magnetoresistive laminated film on the substrate; a vacuum temperature raising chamber for raising a temperature of the substrate with the magnetoresistive laminated film formed thereon in a forced manner; and a robot chamber including a robot which can convey the substrate at least to the substrate standby chamber, the substrate cooling chamber, the vacuum film forming chamber, and the vacuum temperature raising chamber, wherein the substrate standby chamber, the substrate cooling chamber, the vacuum film forming chamber, and the vacuum temperature raising chamber are disposed as independent chambers centering on and on a peripheral edge of the robot chamber via respective shutters.

DETAILED DESCRIPTION OF THE INVENTION

Hereinbelow, the present invention will be described in terms of preferred embodiments with reference to the accompanying drawings.

One embodiment of a film forming apparatus for carrying out a manufacturing method of a magnetoresistive element of the present invention will be described before describing the manufacturing method.

Figure 1:
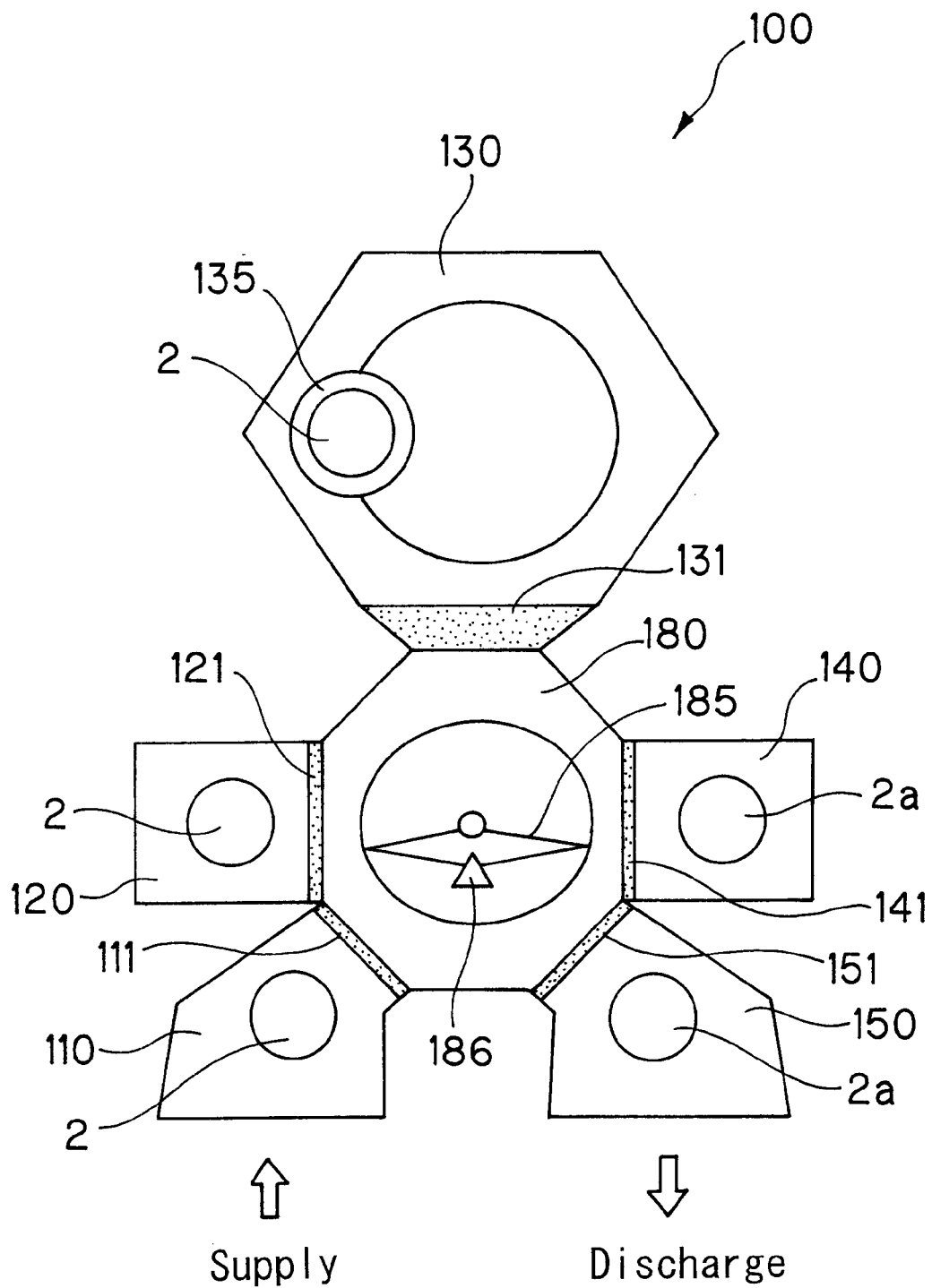
FIG. 1 is a schematic plane view showing a preferable embodiment of an inventive film forming apparatus of the present invention.

FIG. 1 is a schematic plane view showing a preferable embodiment of an inventive film forming apparatus of the present invention.

As shown in FIG. 1, the inventive film forming apparatus 100 of the present invention comprises: a vacuum robot chamber 180 positioned substantially in a middle of the drawing sheet; and respective chambers disposed on a peripheral edge of the robot chamber, that is, a substrate standby chamber 110 in which a substrate 2 (wafer) is on standby; a vacuum substrate cooling chamber 120 for cooling the substrate 2; a vacuum film forming chamber 130 for forming a magnetoresistive laminated film on the substrate 2; a vacuum temperature raising chamber 140 for raising a temperature of a substrate 2a with the magnetoresistive laminated film formed thereon in a forced manner; and a substrate discharge chamber 150 for discharging/laying the substrate 2a with the film formed thereon whose temperature has been raised at the normal temperature (that is the room temperature at about 25° C.).

Atmospheres of these respective chambers 110, 120, 130, 140, 150 can be separated from the robot chamber 180 via respective shutters 111, 121, 131, 141, 151. Additionally, the vacuum temperature raising chamber 140 is not an essential requirement, but is preferably used from a viewpoint of further enhancement of productivity. Instead of particularly independently disposing the substrate discharge chamber 150, the substrate standby chamber 110 can also be used as the substrate discharge chamber. However, in consideration of convenience of a process, as shown in FIG. 1, it is preferable to separately and independently form the substrate standby chamber 110 and substrate discharge chamber 150.

The substrate standby chamber 110 is stocked with a plurality of substrates 2 before treatment for forming thin films, and the substrate standby chamber 110 is evacuated to constitute a vacuum chamber. For example, about 20 minutes are required for evacuation.

One substrate 2 of the substrates 2 disposed in the substrate standby chamber 110 is taken out by a robot hand 186 of a robot 185, and conveyed to the vacuum substrate cooling chamber 120. It takes, for example, two minutes to convey the substrate 2, and of course the shutters 111, 121 are appropriately opened/closed during conveyance.

The substrate cooling chamber 120 is a vacuum chamber, and substrate cooling means (not shown) for cooling the substrate 2 is disposed in the chamber. The substrate cooling means is not particularly limited as long as the substrate 2 can substantially uniformly be cooled. As one preferable embodiment of the substrate cooling means, refrigerants such as liquid nitrogen and liquid helium are passed through a substrate base formed of Cu, Al, Ti, or another material having a large thermal conductivity. In a structure formed in this manner, the substrate base is cooled, and the substrate laid on the substrate base is left to stand for a predetermined time, and cooled at a predetermined temperature. It takes, for example, about 30 minutes to cool the substrate at an absolute temperature of about 150 K.

The substrate 2 cooled at the predetermined temperature is taken out of the substrate cooling chamber 120 by the robot hand 186 of the robot 185, and conveyed to the vacuum film forming chamber 130. It takes, for example, two minutes to convey the substrate 2, and of course the shutters 121, 131 are appropriately opened/closed during conveyance.

A sputter apparatus is disposed in the vacuum film forming chamber 130, the cooled substrate 2 is set on a rotatable substrate holder 135, a predetermined sputter film formation is successively performed with respect to the substrate 2 being rotated, and a magnetoresistive laminated film is formed. A target is omitted from the drawing, but the number of targets corresponding to the number of layers are usually prepared. About 30 minutes are required for forming the laminated film.

The substrates 2a with the magnetoresistive laminated film formed thereon is taken out of the vacuum film forming chamber 130 by the robot hand 186 of the robot 185, and conveyed to the vacuum temperature raising chamber 140. It takes, for example, two minutes to convey the substrate 2a with the film formed thereon, and of course the shutters 131, 141 are appropriately opened/closed during conveyance.

The vacuum temperature raising chamber 140 is a vacuum chamber, and substrate temperature raising means for raising the temperature of the substrate 2a with the film formed thereon at the normal temperature (room temperature (at about 25° C.)) is disposed in the chamber. The substrate temperature raising means is not particularly limited as long as the temperature of the substrate 2a with the film formed thereon can substantially uniformly be raised.

As one preferable embodiment of the substrate temperature raising means, heater or another heating medium is buried in the substrate base formed of Cu, Al, Ti, or another material having a sufficient thermal conductivity. In a structure formed in this manner, the temperature of the substrate base is raised, the substrate 2a with the film formed thereon laid on the substrate base is left to stand for the predetermined time, and the temperature is raised at the normal temperature (room temperature).

For example, it takes about 45 minutes to raise the temperature of the substrate 2a with the film formed thereon at an absolute temperature of about 280 K. Additionally, if the temperature is naturally raised in the substrate standby chamber without performing the forced operation for raising the temperature, this requires much time of about seven hours.

The substrate 2a with the film formed thereon, whose temperature has been completely raised at the normal temperature (room temperature), is taken out of the vacuum temperature raising chamber 140 by the robot hand 186 of the robot 185, and conveyed to the substrate discharge chamber 150.

The substrate 2a with the film formed thereon disposed in the substrate discharge chamber 150 is next transferred to the next process, and divided into individual element portions so that, for example, about 4000 element portions are obtained from one substrate.

Additionally, a system may further be extended in the apparatus of FIG. 1. For example, another vacuum film forming chamber may additionally be disposed, or a new oxidation treatment chamber or a cleaning chamber may also be disposed.

A manufacturing method of the magnetoresistive element of the present invention using the apparatus constituted as described above will next be described.

The manufacturing method of the magnetoresistive element of the present invention comprises: a step of preparing a substrate having a thermal conductivity in a range of 5 to 150 $Wm^{-1}K^{-1}$; a substrate cooling step of moving the substrate into the vacuum cooling chamber, and cooling the substrate at an absolute temperature of 200 K or less in the vacuum cooling chamber; and a laminated film forming step of moving the cooled substrate into the vacuum film forming chamber, fixing the substrate to the substrate holder, rotating the substrate, and forming the magnetoresistive laminated film on the substrate.

Respective steps will be described hereinafter in detail.

Substrate Preparing Step

The substrate in the technical field of the present invention is a so-called wafer, and is a base for constituting a large number of elements. The thermal conductivity of the substrate as an object of the present invention is in a range of 5 to 150 $Wm^{-1}K^{-1}$, preferably 10 to 100 $Wm^{-1}K^{-1}$, more preferably 12 to 80 $Wm^{-1}K^{-1}$. When this value exceeds 150 $Wm^{-1}K^{-1}$, the thermal conductivity becomes excessively large. This causes a disadvantage that a satisfactory film cannot be formed in the subsequent operation of the present invention. That is, the substrate temperature is considered to rise to such a level that a film quality is deteriorated. In this case, the cooling of the substrate and the forming of the film cannot be performed in separate stations. On the other hand, when this value is less than 5 $Wm^{-1}K^{-1}$, excessively much time has to be spent for cooling the substrate. This disadvantageously deteriorates productivity. Examples of a substrate material in the present invention include ceramics such as AlTiC($Al_2O_3 \cdot TiC$), SiC, and AlN. A silicon wafer or the like usually used in a semiconductor field does not correspond to the present substrate.

As described above, the substrate standby chamber, which can be a vacuum chamber, is usually stocked with a plurality of substrates on standby. A standby atmosphere can be a vacuum atmosphere. Additionally, the "vacuum" and "vacuum atmosphere" mentioned in the present specification indicates a degree of vacuum of the order of $10^{-3}$ to $10^{-9}$ Pa.

Substrate Cooling Step

The substrate is moved to the vacuum cooling chamber, and cooled in this chamber at an absolute temperature 200 K or less, particularly in a range of 50 to 150 K. The substrate is cooled in the vacuum atmosphere. With a value exceeding 200 K, a sputtered laminated film which is formed on the substrate and which indicates a magnetoresistive effect is not a satisfactory film, and a disadvantage occurs that enhancement of a film property cannot be expected. A method of cooling the substrate is not particularly limited as long as the substrate can substantially uniformly be cooled as described above. One preferable embodiment of the method comprises: forming a structure beforehand in which the refrigerants such as liquid nitrogen and liquid helium are passed in the substrate base having a satisfactory thermal conductivity as described above; cooling the substrate base while leaving the substrate laid on the substrate base to stand for the predetermined time; and cooling the substrate at the predetermined temperature.

Additionally, the inner atmosphere of the vacuum cooling chamber can be separated by the openable/closable shutter, and the like.

Magnetoresistive Laminated Film Forming Step

Subsequently, the cooled substrate is moved into the vacuum film forming chamber, and fixed to the substrate holder disposed in the chamber. Since the substrate holder has a rotatable mechanism, the magnetoresistive laminated film can be formed on the substrate by a sputtering process during rotation of the substrate. Additionally, the mechanism for passing the refrigerant and cooling the substrate is not formed in the substrate holder.

As described above, the present substrate has a desired thermal conductivity property. Therefore, when the substrate is once cooled at the desired temperature even in another stage (cooling step in the substrate cooling chamber), and subsequently the present magnetoresistive film is formed in a stopped state of the cooling operation, a remarkably good-quality film can be formed. Additionally, when the substrate cooling treatment is performed in the stage separate from the stage for forming the film, the film can be formed on the substrate being rotated in the present film forming step. Therefore, dispersions of properties of thousands of elements formed on the substrate are remarkably reduced, and the element superior in reliability can be manufactured. About 30 minutes are usually required until the magnetoresistive laminated film is completely formed.

Here, examples of the magnetoresistive laminated film formed on the substrate include a giant magnetoresistive (GMR) film, and particularly preferably a spin-valve magnetoresistive film, and a tunnel magnetoresistive (TMR) film.

Figure 2:
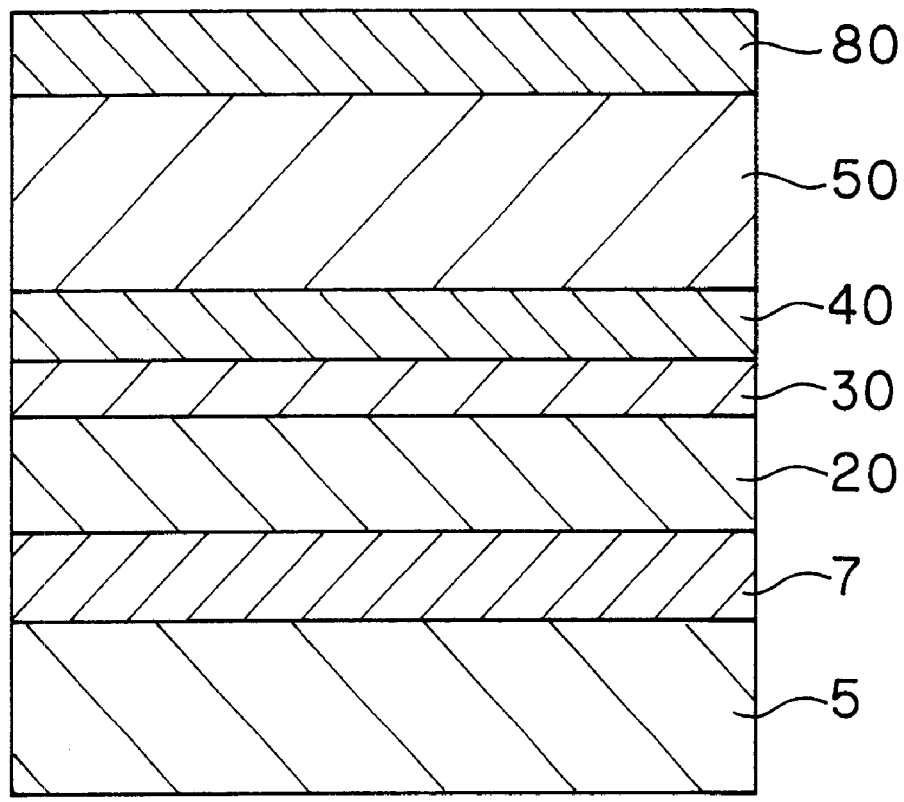
FIG. 2 is a sectional view of one embodiment showing a basic structure of a spin-valve magnetoresistive film.

FIG. 2 shows one embodiment showing a basic structure of a so-called spin-valve magnetoresistive film as a preferable embodiment of the giant magnetoresistive (GMR) film.

As shown in FIG. 2, the spin-valve magnetoresistive film has a laminate structure including: a nonmagnetic metal layer 30 formed, for example, of Cu; a ferromagnetic layer 40 formed, for example, of NiFe on one surface of the nonmagnetic metal layer 30; a soft magnetic layer 20 formed, for example, of NiFe on the other surface of the nonmagnetic metal layer 30; and an antiferromagnetic layer 50 formed, for example, of PtMn on the ferromagnetic layer 40 (i.e., on the surface of the ferromagnetic layer, which is opposite to the surface in contact with the nonmagnetic metal layer 30) in order to pin/fix a magnetization direction of the ferromagnetic layer 40.

As shown in FIG. 2, the laminate is usually formed on a substrate 5, and the soft magnetic layer 20, nonmagnetic metal layer 30, ferromagnetic layer 40, and antiferromagnetic layer 50 are laminated in order from a substrate 5 side via an underlayer 7. As shown in FIG. 2, a protective layer 80 is further formed on the antiferromagnetic layer 50. This laminate structure is simply one example and can variously be modified. Each of these function layers may be formed of not only a single layer but also two or more layers. For example, the soft magnetic layer 20 or the ferromagnetic layer 40 is not limited to a single layer. A laminate formed of a combination of a pair of magnetic layers having antiferromagnetic junction, and a nonmagnetic metal layer held between the magnetic layers is one of particularly preferable forms. Examples of the laminate include a ferromagnetic layer formed of a three-layer laminate of CoFe (having a thickness of 30 angstroms)/Ru (7 angstroms)/CoFe (20 angstroms). Moreover, there are also known variations with respect to respective layer compositions.

Examples of a preferable constitution of the spin-valve magnetoresistive film are as follows. Additionally, numerals within parentheses attached next to the composition indicate a film thickness (unit: angstroms).

(1) Ta(30)/NiFe(50)/CoFe(5)/Cu(24)/CoFe(20)/PtMn(150)/Ta(30)
(2) Ta(30)/PtMn(150)/CoFe(20)/Cu(24)/CoFe(5)/NiFe(50)/Ta(30)
(3) Ta(30)/NiFe(50)/CoFe(5)/Cu(24)/CoFe(30)/Ru(7)/CoFe(20)/PtMn(150)/Ta(30)
(4) Ta(30)/PtMn(150)/CoFe(20)/Ru(7)/CoFe(30)/Cu(24)/CoFe(5)/NiFe(50)/Ta(30)
(5) Ta(30)/PtMn(150)/CoFe(20)/Cu(24)/CoFe(5)/NiFe(50)/CoFe(5)/Cu(24)/CoFe(20)/PtMn(150)/Ta(30)
(6) Ta(30)/PtMn(150)/CoFe(20)/Ru(7)/CoFe(30)/Cu(24)/CoFe(5)/NiFe(50)/CoFe(5)/Cu(24)/CoFe(30)/Ru(7)/CoFe(20)/PtMn(150)/Ta(30)

Figure 3:
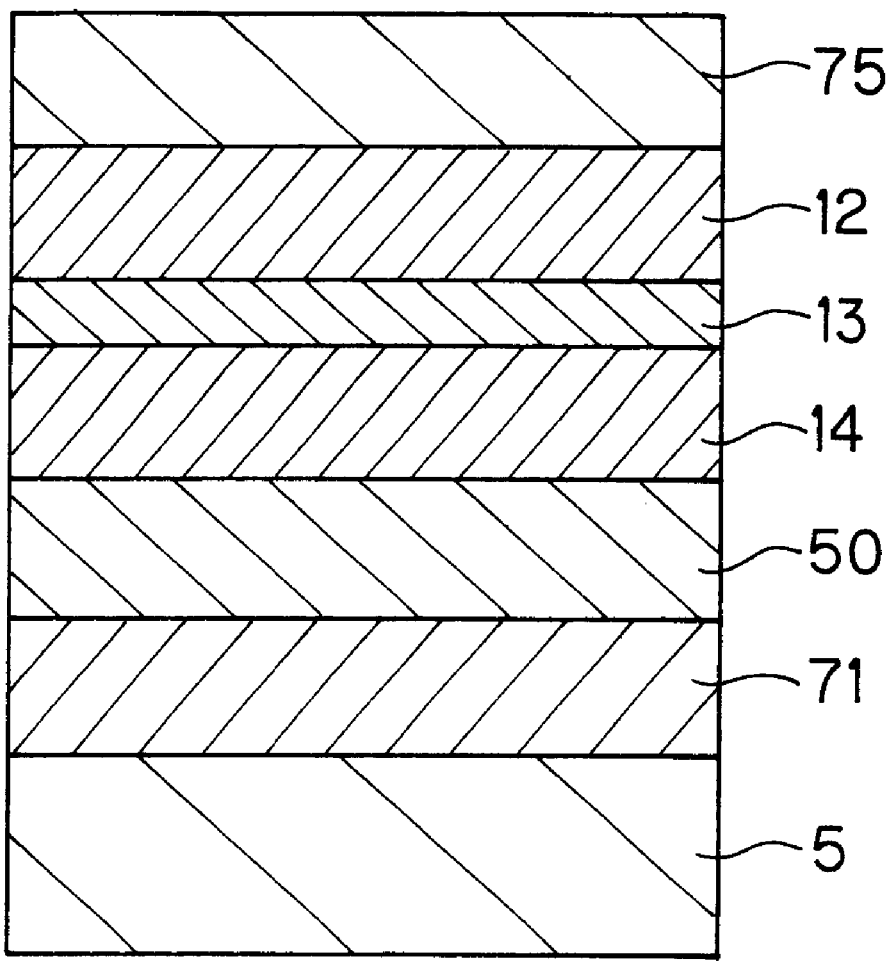
FIG. 3 is a sectional view of one embodiment showing a basic structure of a tunnel magnetoresistive film.

FIG. 3 shows one preferred embodiment of the tunnel magnetoresistive film (TMR film). In the embodiment, the tunnel magnetoresistive film (TMR film) has a multilayered structure in which a tunnel barrier layer 13, and a first ferromagnetic layer 12 and second ferromagnetic layer 14 formed to sandwich the tunnel barrier layer 13 therebetween are laminated as a main part.

In the basic structure of the tunnel multilayered film, a pair of electrodes 71 and 75 for passing a current in a thickness direction of the tunnel multilayered film are laminated and electrically connected to each other in outer directions of the first and second ferromagnetic layers 12 and 14, respectively.

Among two ferromagnetic layers 12, 14, for example, the first ferromagnetic layer 12 functions as a so-called free layer in which the magnetization direction can freely be changed in response to an external magnetic field as magnetic information. Generally, the second ferromagnetic layer 14 functions as a magnetization pinning layer in which the magnetization direction of the ferromagnetic layer 14 is pinned in a constant direction. In the embodiment, for example, the pinning layer 50, formed of an antiferromagnetic layer, for pinning the magnetization of the ferromagnetic layer 14 is formed. That is, in the embodiment shown in FIG. 3, the electrode 71, pinning layer 50, second ferromagnetic layer 14, tunnel barrier layer 13, first ferromagnetic layer 12, and electrode 75 are successively formed on the substrate 5.

A material constituting the ferromagnetic layers 12 and 14 is preferably a high spin polarization material with which a high TMR change rate is obtained. Examples of the material include Fe, Co, Ni, FeCo, NiFe, CoZrNb, FeCoNi, and the like. The thickness of the ferromagnetic layer 12 is in a range of 20 to 200 angstroms, preferably 40 to 100 angstroms. With an excessively large film thickness, an output at a time of head operation tends to decrease. Moreover, with an excessively small film thickness, magnetic property becomes unstable and a noise at the time of the head operation disadvantageously increases. The thickness of the ferromagnetic layer 14 is in a range of 10 to 50 angstroms, preferably 20 to 30 angstroms. With the excessively large film thickness, pinning of magnetization by the antiferromagnetic material is weakened as described later. Moreover, with the excessively small film thickness, TMR change ratio tends to decrease.

The first and second ferromagnetic layers 12 and 14 are not limited to the single layer. The laminate formed of a combination of a pair of magnetic layers having the antiferromagnetic junction, and nonmagnetic metal layer held between the magnetic layers is one of particularly preferable forms. Examples of the laminate include the ferromagnetic layer formed of the three-layer laminate of CoFe (having a thickness of 30 angstroms)/Ru (7 angstroms)/CoFe (20 angstroms).

Examples of the preferable film constitution of the TMR film are as follows. Additionally, the numerals within parentheses attached next to the composition indicate the film thickness (unit: angstroms). Indication Al(7)-Ox means an aluminum oxide film formed by subjecting a seven angstroms thick Al film to an oxidation treatment.

(1) Ta(30)/NiFe(50)/CoFe(5)/Al(7)-Ox/CoFe(20)/PtMn(150)/Ta(30)
(2) Ta(30)/PtMn(150)/CoFe(20)/Al(7)-Ox/CoFe(5)/NiFe(50)/Ta(30)
(3) Ta(30)/NiFe(50)/CoFe(5)/Al(7)-Ox/CoFe(30)/Ru(7)/CoFe(20)/PtMn(150)/Ta(30)
(4) Ta(30)/PtMn(150)/CoFe(20)/Ru(7)/CoFe(30)/Al(7)-Ox/CoFe(5)/NiFe(50)/Ta(30)
(5) Ta(30)/PtMn(150)/CoFe(20)/Al(7)-Ox/CoFe(5)/NIFe(50)/CoFe(5)/Al(7)-Ox/CoFe(20)/PtMn(150)/Ta(30)
(6) Ta(30)/PtMn(150)/CoFe(20)/Ru(7)/CoFe(30)/Al(7)-Ox/CoFe(5)/NiFe(50)/CoFe(5)/Al(7)-Ox/CoFe(30)/Ru(7)/CoFe(20)/PtMn(150)/Ta(30)

Step of Forcedly Raising Temperature of Substrate

The substrate with the magnetoresistive laminated film formed thereon is moved to the vacuum temperature raising chamber, and a treatment for forcedly raising the temperature of the laminated substrate is performed in the vacuum temperature raising chamber. This particularly preferably enhances productivity.

As described above, the vacuum temperature raising chamber is the vacuum chamber, and the substrate temperature raising means for raising the temperature of the substrate at the room temperature is disposed in the chamber. As one preferable embodiment of the substrate temperature raising means, the heater or another heating medium is buried in the substrate base formed, for example, of Cu having a high thermal conductivity. In the structure formed in this manner, the temperature of the substrate base is raised, the substrate laid on the substrate base is left to stand for the predetermined time, and the temperature is raised at the normal temperature (room temperature). Since this step is carried out, the productivity is remarkably enhanced as described above.

Substrate Discharge Preparation Step

The substrate with the film formed thereon, whose temperature has completely been raised at the room temperature, is usually conveyed to the substrate discharge chamber, and temporarily stored in the chamber.

The substrate with the film formed thereon disposed and stored in the substrate discharge chamber is cut/divided into individual element portions and, for example, about 4000 element portions are obtained from one substrate in the next element forming step as described above.

In the manufacturing method of the present invention, there can be provided a product having little dispersion of element property and having high reliability. Moreover, productivity is also remarkably superior in the following respect. That is, in the manufacturing method of the present invention, since the substrate cooling step and the magnetoresistive laminated film forming step are independently performed in the separate stages, these treatments can simultaneously be performed in parallel to each other (e.g., one substrate is in the cooling step, and the other substrate is in the film forming step). For example, when one set of 12 wafers is continuously produced, the productivity can remarkably be enhanced. Furthermore, when the step of forcedly raising the temperature of the substrate is incorporated, the productivity is remarkably enhanced. For concrete numeric values, when one set of 12 wafers is continuously produced, about 20 hours are required in the conventional method, but the time can be shortened to about 15 hours in the present invention (without forcedly raising the temperature of the substrate). Furthermore, the present inventors have confirmed that the time can be shortened to about nine hours by incorporating the step of forcedly raising the temperature of the substrate.

EXPERIMENT EXAMPLE 1

Preparation of Sample of Example 1

The apparatus shown in FIG. 1 was used, the following plurality of steps were performed, and the tunnel magnetoresistive film was prepared as a main part of a tunnel magnetoresistive head.

Substrate Preparing Step

That is, first, an AlTiC substrate having a thickness of 2 mm and diameter of 72 mm (thermal conductivity: 25 $Wm^{-1}K^{-1}$) was prepared as the substrate 5, the substrate was allowed to be on standby in the substrate standby chamber, and the substrate standby chamber was evacuated to obtain a vacuum atmosphere. It took 20 minutes to form the vacuum atmosphere.

Substrate Cooling Step

The substrate in the substrate standby chamber was moved onto the substrate base in the vacuum cooling chamber by the robot. A movement time was two minutes. Additionally, during movement, the shutters of the substrate standby chamber and vacuum cooling chamber were appropriately opened/closed so that the robot could handle the substrate.

The refrigerant of liquid helium was passed in the substrate base in the vacuum cooling chamber, and the whole substrate was cooled at 150 K by thermal conduction from a portion in which the substrate was laid. A time required for cooling the substrate was 30 minutes.

Magnetoresistive Laminated Film Forming Step

The substrate in the vacuum cooling chamber was moved onto the substrate holder in the vacuum film forming chamber by the robot. The movement time was two minutes. Additionally, during movement, the shutters of the vacuum cooling chamber and vacuum film forming chamber were appropriately opened/closed so that the robot could handle the substrate. Thereafter, while the substrate was rotated at a rotation speed of 180 rpm, sputtering film formation was performed. The constitution of the tunnel magnetoresistive laminated film formed on the AlTiC substrate was as follows. Additionally, the numerals attached next to the composition indicate the film thickness (angstroms).

Ta(30)/NiFe(50)/CoFe(5)/Al(7)-Ox/CoFe(30)/Ru(7)/CoFe(20)/PtMn(150)/Ta(30)

The substrate with the film completely formed thereon in this manner was moved to the vacuum temperature raising chamber (movement time of two minutes), and the temperature of the substrate was forcedly raised at the normal temperature in the chamber. It took 45 minutes to raise the temperature. Additionally, if the temperature is naturally raised under a vacuum atmosphere without using the aforementioned vacuum temperature raising chamber, it requires seven hours to return the substrate temperature to the normal temperature. This was experimentally confirmed.

About 4000 elements were manufactured from the substrate (wafer) with the magnetoresistive film formed thereon in this manner through a segmenting/processing step, and 40 elements (sample ID: 1 to 40) arbitrarily extracted from these elements were used to measure (1) a resistance value of the element and (2) TMR change ratio in the following procedure.

Measurement of (1) Resistance Value ($\Omega$) of Element and (2) TMR Change Ratio (%)

A test pattern with a size of 0.6 $\mu$m×0.6 $\mu$m, and 4-terminal process were used to obtain the value and ratio. Concretely, a measurement current of 0.1 mA was applied, and an applied voltage of this time was measured. A measured result of voltage and a calculated value obtained according to an ohm law constitute the resistance value.

During measurement of the resistance value, a magnetic field of ±2000 oersteds was applied, dependence of the resistance value on the applied magnetic field was evaluated, and a minimum resistance value Rmin obtained during the evaluation was measured as the "resistance value ($\Omega$)". A maximum resistance value Rmax and minimum resistance value Rmin obtained during the evaluation of dependence of the resistance value on the applied magnetic field were used to obtain the TMR change ratio from the following equation.

TMR change ratio=($R$max–$R$min)/$R$min×100(%)

Preparation of Comparative Example Sample 1

The tunnel magnetoresistive film was prepared as a comparative example through the following steps.

First, the AlTiC substrate having a thickness of 2 mm and diameter of 72 mm (thermal conductivity: 25 $Wm^{-1}K^{-1}$) was prepared as the substrate 5, the substrate was allowed to be on standby in the substrate standby chamber, and the substrate standby chamber was evacuated to obtain the vacuum atmosphere. It took 20 minutes to form the vacuum atmosphere.

The substrate in the substrate standby chamber was moved onto the substrate holder in the vacuum film forming chamber by the robot. The movement time was two minutes. Additionally, during movement, the shutters of the substrate standby chamber and vacuum film forming chamber were appropriately opened/closed so that the robot could handle the substrate.

The refrigerant of liquid helium was passed in the substrate holder in the vacuum film forming chamber, and the whole substrate was cooled at 150 K by thermal conduction from the portion in which the substrate was laid. At this time, the tunnel magnetoresistive film similar to the sample of Example 1 was formed on the substrate in the vacuum film forming chamber. Additionally, the substrate holder was not rotated during the film formation. Moreover, the cooling of the substrate was not stopped even during the film formation.

The temperature of the substrate with the film completely formed thereon in this manner was naturally raised over seven hours at the normal temperature under vacuum atmosphere.

About 4000 elements were manufactured from the substrate (wafer) with the magnetoresistive film of the comparative example formed thereon in this manner through the segmenting/processing step, and 40 elements (sample ID: 1 to 40) arbitrarily extracted from these elements were used to measure (1) the resistance value of the element and (2) TMR change ratio similarly as Example 1.

Results are shown in Table 1. For ease of visual understanding of the results of Table 1, graphs are shown in FIGS. 4 and 5.

TABLE 1

| Sample ID | Manufacturing method of invention | | Manufacturing method of comparative example | |
|---|---|---|---|---|
| | Resistance value ($\Omega$) | TMR change ratio (%) | Resistance value ($\Omega$) | TMR change ratio (%) |
| 1 | 57.3 | 31.6 | 64.7 | 32.7 |
| 2 | 54.0 | 33.1 | 56.0 | 32.5 |
| 3 | 56.4 | 32.8 | 42.5 | 33.5 |
| 4 | 53.5 | 32.4 | 65.4 | 31.8 |
| 5 | 58.2 | 32.8 | 60.5 | 31.4 |
| 6 | 55.9 | 33.4 | 58.1 | 32.1 |
| 7 | 54.0 | 31.5 | 50.1 | 31.8 |
| 8 | 53.5 | 32.3 | 62.7 | 31.4 |
| 9 | 57.3 | 32.4 | 66.1 | 32.5 |
| 10 | 58.6 | 33.5 | 42.5 | 31.6 |
| 11 | 55.4 | 31.8 | 48.8 | 33.1 |
| 12 | 54.5 | 31.4 | 62.7 | 32.8 |
| 13 | 53.5 | 32.1 | 49.4 | 32.4 |
| 14 | 55.9 | 33.4 | 45.4 | 31.6 |
| 15 | 54.0 | 31.5 | 65.0 | 31.3 |
| 16 | 57.3 | 32.3 | 62.3 | 31.8 |
| 17 | 57.7 | 32.4 | 50.1 | 31.9 |
| 18 | 55.9 | 32.8 | 59.1 | 32.5 |
| 19 | 53.5 | 31.4 | 66.7 | 32.1 |
| 20 | 57.7 | 31.5 | 62.7 | 32.8 |
| 21 | 58.6 | 31.7 | 43.3 | 31.8 |
| 22 | 54.0 | 32.8 | 55.4 | 31.4 |
| 23 | 55.4 | 31.8 | 61.4 | 32.3 |
| 24 | 56.9 | 31.4 | 46.1 | 32.8 |
| 25 | 53.5 | 32.3 | 52.5 | 33.4 |
| 26 | 57.3 | 32.8 | 63.9 | 31.5 |
| 27 | 58.6 | 31.6 | 55.4 | 32.3 |
| 28 | 56.4 | 31.3 | 57.0 | 32.4 |
| 29 | 57.7 | 31.8 | 64.7 | 32.8 |
| 30 | 52.9 | 31.9 | 50.1 | 31.4 |
| 31 | 57.3 | 32.5 | 41.8 | 31.5 |
| 32 | 54.5 | 32.1 | 60.9 | 31.7 |
| 33 | 57.3 | 32.8 | 50.7 | 31.8 |
| 34 | 54.0 | 31.3 | 60.5 | 31.2 |
| 35 | 56.4 | 31.8 | 52.5 | 32.6 |
| 36 | 52.9 | 31.9 | 56.5 | 32.7 |
| 37 | 55.4 | 32.5 | 51.9 | 32.1 |
| 38 | 54.5 | 32.5 | 54.8 | 32.5 |
| 39 | 53.5 | 31.6 | 49.4 | 31.6 |
| 40 | 57.7 | 33.1 | 65.0 | 31.8 |
| AVG | 55.7 | 32.3 | 55.9 | 32.1 |
| $\sigma$ | 1.64 | 0.64 | 7.53 | 0.60 |

Figure 4:
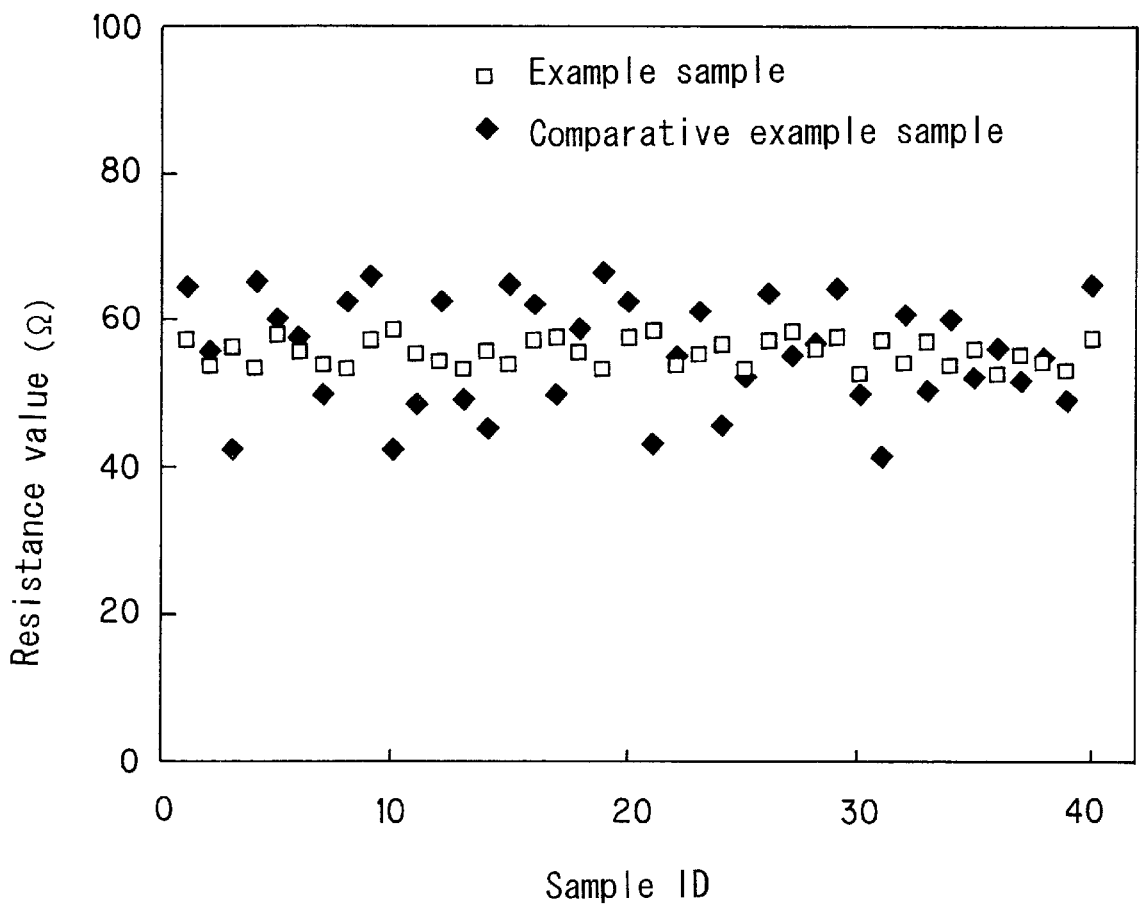
FIG. 4 is a graph showing a relation between each sample (sample ID) and a resistance value ($\Omega$) in Table 1.
Figure 5:
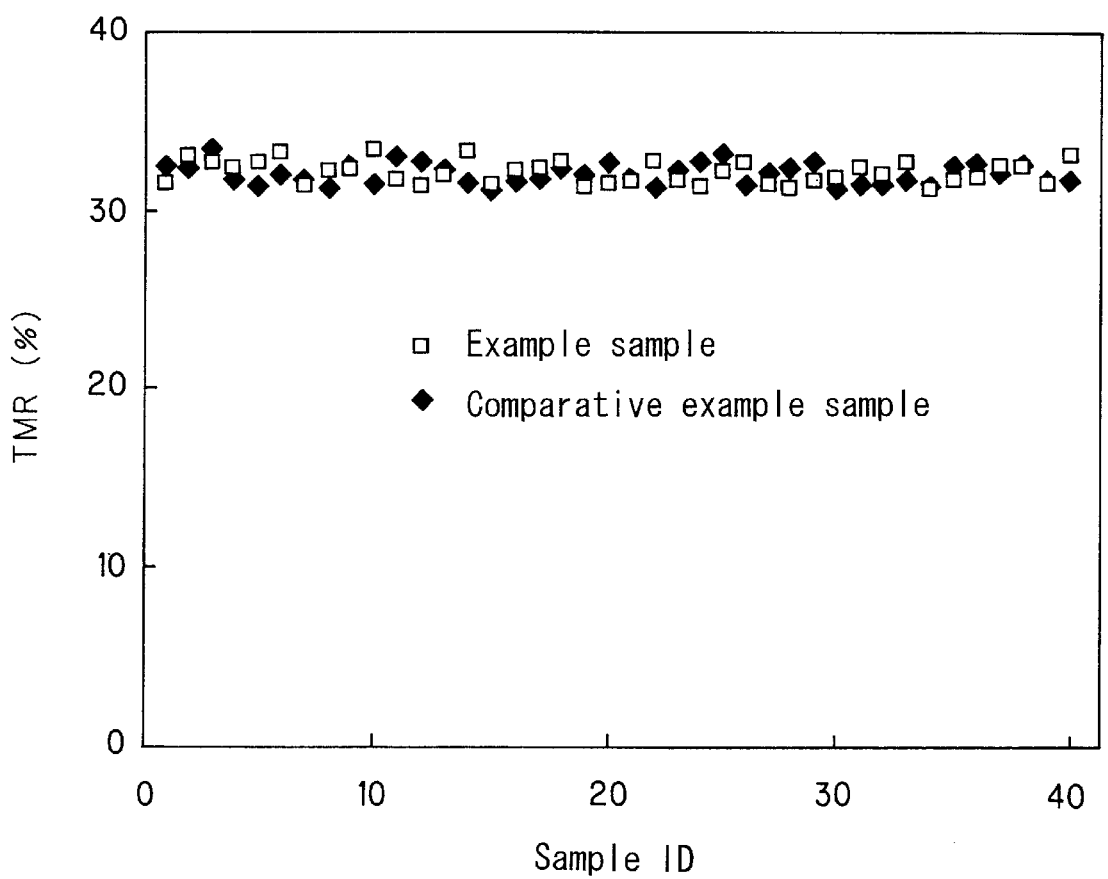
FIG. 5 is a graph showing a relation between each sample (sample ID) and TMR (%) in Table 1.

As shown in Table 1 and graphs of FIGS. 4 and 5, when the substrate cooling step and film forming step are performed in the separate stages, and the cooled substrate is rotated as in the present invention, a state of the formed film is uniformed, and therefore the dispersion of the resistance value can be suppressed. Thereby, when the head is driven at a constant current, the dispersion of the voltage applied to each element can preferably be suppressed.

Additionally, the value of TMR change ratio was substantially equivalent and a difference in degree of the dispersion was not seen between the example and the comparative example. Therefore, even when the substrate is cooled at the predetermined temperature, then conveyed to the vacuum film forming chamber, and subsequently subjected to sputter film formation as in the method of the present invention, much rise of the substrate temperature is not seen. An equivalent grain size or film quality is considered to be obtained as compared with the method of sputter-forming the film while cooling the substrate.

EXPERIMENTAL EXAMPLE 2

The tunnel magnetoresistive film was changed to a spin-valve film having the following film constitution in preparation of the samples of Example 1 and Comparative Example 1.

AlTiC/NiCr50/NiFe30/CoFe10/Cu20/CoFe25/Ru8/CoFe15/PtMn120/Ta30

The spin-valve magnetoresistive elements of Example 2 and Comparative Example 2 were prepared similarly as Example 1 and Comparative Example 1 in other respects.

With respect to these elements, the resistance value ($\Omega$) and MR change ratio (%) were measured. Also in this case, a tendency similar to that shown in the graphs of FIGS. 4 and 5 was confirmed.

EXPERIMENTAL EXAMPLE 3

The substrate used in Experiment Example 1 was changed to a substrate having the following thermal conductivity. Various element samples were prepared similarly as Example 1 of Experiment Example 1 in the other respects.

Substrate material 1: SiC, thermal conductivity of 68 $Wm^{-1}K^{-1}$ (present invention)

Substrate material 2: AlN, thermal conductivity of 90 $Wm^{-1}K^{-1}$ (present invention)

Substrate material 3: Si, thermal conductivity of 168 $Wm^{-1}K^{-1}$ (comparative example)

The elements using the substrate materials 1 and 2 obtained satisfactory data substantially equivalent to the data of Example 1 of Experiment Example 1. However, for the element using the substrate material 3, the temperature rise of the substrate in the film formation was large during movement to the film forming chamber from the cooling chamber, and the satisfactory data substantially equivalent to the data of Example 1 of Experiment Example 1 could not be obtained.

From the above results, an effect of the present invention is apparent. That is, the present invention is constituted to include: the step of preparing the substrate having the thermal conductivity in the range of 5 to 150 $Wm^{-1}K^{-1}$; the substrate cooling step of moving the substrate into the vacuum cooling chamber, and cooling the substrate at the absolute temperature of 200 K or less in the vacuum cooling chamber; and the laminated film forming step of moving the cooled substrate into the vacuum film forming chamber, fixing the substrate to the substrate holder, and forming the magnetoresistive laminated film on the substrate while rotating the substrate. Therefore, a remarkably superior effect can be achieved that the dispersion of element property is little, reliability is high, and productivity can be enhanced.

What is claimed is:

1. A manufacturing method of a magnetoresistive element, comprising:

a step of preparing a substrate having a thermal conductivity in a range of 5 to 150 $Wm^{-1}K^{-1}$;

a substrate cooling step of moving said substrate into a vacuum cooling chamber, and cooling the substrate at an absolute temperature of 200 K or less in the vacuum cooling chamber; and a laminated film forming step of moving said cooled substrate into a vacuum film forming chamber, fixing the substrate to a substrate holder, and forming a magnetoresistive laminated film on the substrate while rotating the substrate.

2. The manufacturing method of the magnetoresistive element according to claim 1 wherein said magnetoresistive laminated film is a giant magnetoresistive film.

3. The manufacturing method of the magnetoresistive element according to claim 2 wherein said magnetoresistive laminated film is a tunnel magnetoresistive film.

4. The manufacturing method of the magnetoresistive element according to claim 2 wherein said magnetoresistive laminated film is a spin-valve magnetoresistive film.

5. The manufacturing method of the magnetoresistive element according to claim 2 wherein said magnetoresistive laminated film is a film formed by a sputtering process.

6. A manufacturing method of a magnetoresistive element, comprising:

a step of preparing a substrate having a thermal conductivity in a range of 5 to 150 $Wm^{-1}K^{-1}$;

a substrate cooling step of moving said substrate into a vacuum cooling chamber, and cooling the substrate at an absolute temperature of 200 K or less in the vacuum cooling chamber;

a laminated film forming step of moving said cooled substrate into a vacuum film forming chamber, fixing the substrate to a substrate holder, and forming a magnetoresistive laminated film on the substrate while rotating the substrate; and a step of moving the substrate with the laminated film formed thereon into a vacuum temperature raising chamber, and raising the temperature of the substrate with the film formed thereon in a forced manner in the vacuum temperature raising chamber.

7. The manufacturing method of the magnetoresistive element according to claim 6 wherein said magnetoresistive laminated film is a giant magnetoresistive film.

8. The manufacturing method of the magnetoresistive element according to claim 7 wherein said magnetoresistive laminated film is a tunnel magnetoresistive film.

9. The manufacturing method of the magnetoresistive element according to claim 7 wherein said magnetoresistive laminated film is a spin-valve magnetoresistive film.

10. The manufacturing method of the magnetoresistive element according to claim 7 wherein said magnetoresistive laminated film is a film formed by a sputtering process.

* * * * *